United States Patent [19]

Bayer

[11] 4,368,245
[45] Jan. 11, 1983

[54] METHOD FOR MAKING MATT DIFFUSION PATTERNS

[75] Inventor: Erich Bayer, Trostberg, Fed. Rep. of Germany

[73] Assignee: Dr. Johannes Heidenhain GmbH, Traunreut, Fed. Rep. of Germany

[21] Appl. No.: 205,564

[22] Filed: Nov. 10, 1980

[30] Foreign Application Priority Data

Nov. 16, 1979 [DE] Fed. Rep. of Germany ....... 2946235

[51] Int. Cl.³ ............................................. G03C 5/06
[52] U.S. Cl. ....................................... 430/5; 430/321; 430/323; 430/324; 430/314; 430/326
[58] Field of Search .................. 430/5, 321, 313, 312, 430/316, 314, 327, 329, 323–326

[56] References Cited

U.S. PATENT DOCUMENTS 3,240,602  3/1966  Johnson ............................. 430/316
4,068,018  1/1978  Hashimoto et al. .................... 430/5
4,174,219  11/1979  Andres et al. ....................... 430/321

FOREIGN PATENT DOCUMENTS 2261780  9/1979  Fed. Rep. of Germany .

Primary Examiner—Won H. Louie, Jr.
Attorney, Agent, or Firm—Hume, Clement, Brinks, Willian & Olds, Ltd.

[57] ABSTRACT

A process for photolithographically producing matt diffusion patterns is disclosed. The matt diffusion patterns can be formed along with opaque and transparent patterns on the same pattern carrier plate. According to this process, a photoexposure mask corresponding to the desired matt pattern is made by photolithography, which mask is then used in subsequent photolithographic processes to form the matt diffusion pattern on pattern carrier plates. The process of making the exposure mask involves forming a mask of a desired diffusion pattern, applying a photoresist layer to the mask, exposing the photoresist layer through a diffusion plate, developing the photoresist layer, applying an opaque layer to the mask, and removing the photoresist layer. In subsequent photolithographic processes the exposure mask is printed on transparent pattern carrier plates, and the exposed areas of the pattern carrier plates are deeply etched to form the matt diffusion patterns.

11 Claims, 9 Drawing Figures

METHOD FOR MAKING MATT DIFFUSION PATTERNS

CROSS-REFERENCE TO RELATED APPLICATIONS

This application is the United States counter-part of West German Application Ser. No. P 29 46 235.9, dated Nov. 16, 1979, whose priority is hereby claimed for this application.

BACKGROUND OF THE INVENTION

This invention relates to an improved method of making matt diffusion patterns, in particular to methods of making matt diffusion patterns along with opaque and transparent patterns. Such diffusion patterns are utilized, for example, in photographic camera viewfinders, and on theodolite grid plates.

Hitherto, matt diffusion patterns have been made by applying the desired pattern in the form of an opaque layer to a ground glass pattern carrier plate. This process has not produced completely satisfactory results, however, because holes have tended to form in the opaque areas and thus to produce imperfect patterns. Also, this means of producing patterns has the limitation that only matt and opaque patterns can be produced thereby on a single carrier plate.

SUMMARY OF THE INVENTION

The present invention is directed to a method of making matt diffusion patterns which avoids these and other problems of the prior art. In particular, the present invention is directed to a photolithographical method of making matt diffusion patterns along with either or both of opaque and transparent patterns on a transparent pattern carrier plate.

According to this invention, a photoexposure mask corresponding to the desired matt pattern is made by photolithography, which mask is then used in subsequent photolithographic processes to form the matt diffusion pattern on pattern carrier plates.

To generate the photoexposure mask, a photoresist layer is applied to a mask of the desired matt diffusion pattern, exposed through a matt diffusion plate, and developed. An opaque layer is then applied over the mask, and the photoresist layer which remained after developing, along with those portions of the opaque layer lying thereon, is removed.

The photoexposure mask thus formed is used to photolitographically create the desired matt diffusion pattern on the pattern carrier plates. In a preferred embodiment of the invention, a transparent pattern carrier plate has applied thereto an opaque layer. The opaque layer is covered with a photoresist layer which is then photographically exposed through the photoexposure mask described above, and the photoresist layer is developed. The layer-bearing face of the pattern carrier plate is then treated with etching substances to etch away the opaque layer and the surface of the pattern carrier plate in those areas which were exposed by developing of the photoresist layer. The surface of the pattern carrier plate is etched deeply so that the remaining opaque layer is underetched slightly. This underetching removes small points of the opaque layer from the matt diffusion pattern areas.

Finally, portions of the remaining opaque layer are removed to form the transparent pattern.

One important advantage of this method of producing matted patterns is that matt diffusion patterns can be produced along with both transparent and opaque patterns on a single pattern carrier plate.

Another advantage of this method of producing patterns is that matt diffusion patterns can be produced along with transparent and opaque patterns by means of using a single exposure mask.

Yet another advantage of this method is that improved patterns can be made because holes no longer tend to form in the opaque portions of the pattern.

The invention itself, together with further objects and attendant advantages, will be best understood by reference to the following detailed description taken in connection with the accompanying drawings.

BRIEF DESCRIPTION OF THE DRAWINGS

FIG. 1a shows the photolithographic formation of the opaque portions of the mask pattern;

FIG. 1b shows the exposure mask with the opaque portions of the mask pattern formed;

FIG. 1c shows the exposure step of the photolithographic formation of the diffusion portion of the mask pattern;

FIG. 1d shows the mask after application of the diffusion pattern forming opaque layer;

FIG. 1e shows the final exposure mask.

FIG. 2a shows the carrier plate as it initially appears before processing;

FIG. 2b shows the carrier plate after photolithographic processing to imprint thereon the image of the exposure mask of FIG. 1e;

FIG. 2c shows the carrier plate after etching of the carrier plate surface;

FIG. 2d shows the final pattern carrier plate with the matt diffusion pattern.

DETAILED DESCRIPTION OF A PREFERRED EMBODIMENT

Figure 1A:
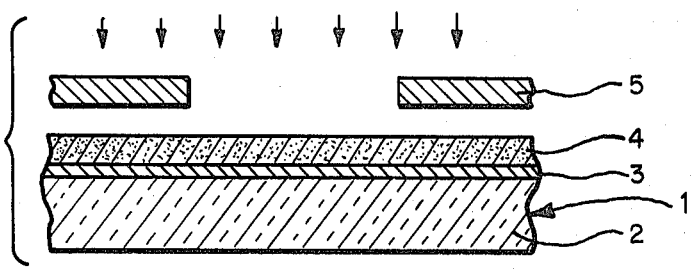
FIGS. 1a through 1e show stages in the production of the exposure mask.

Referring now to the drawings, FIG. 1 shows stages in the formation of the matt diffusion exposure mask 1.

As FIG. 1a shows, the exposure mask 1 is formed from a polished transparent substrate or layer carrier 2 which carries on one face an opaque layer 3. The opaque layer 3 is preferably a layer of chromium. The opaque layer 3 is covered with a layer of photoresistant photolacquer 4.

The photolacquer layer 4 is photographically exposed through an auxiliary mask 5. The auxiliary mask 5 is opaque but for areas which correspond to the desired final matt diffusion pattern, which are either cut out of the auxiliary mask 5 or left transparent.

After exposure, the photolacquer layer 4 is developed to remove those portions of the photolacquer layer that were exposed. Etching substances are then applied to etch away those portions of the opaque layer 3 which have no photolacquer layer 4 covering them. After etching, the remains of the photolacquer layer 4 are removed. Thus, exposure of the photolacquer layer 4 through the auxiliary mask 5, followed by photolithographic processing, removes from the opaque layer 5 the areas of the matt diffusion pattern of the final diffusion plate, as shown in FIG. 1b.

Figure 1B:
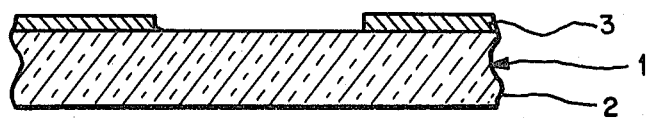
Figure 1C:
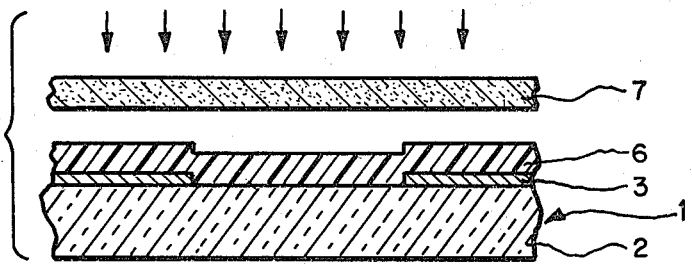

The partially formed mask 1 of FIG. 1b is next covered with a new layer of photolacquer 6 and is photographically exposed through a matt diffusion plate 7, as shown in FIG. 1c. The matt diffusion plate 7 is preferably a plate of glass with ground unpolished surfaces.

Figure 1D:
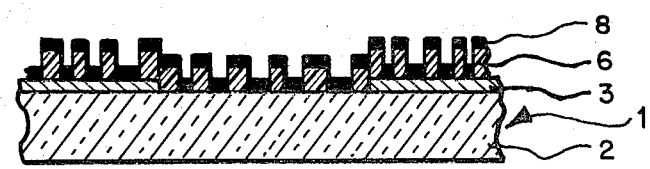

The photolacquer layer 6 is developed to remove the exposed portions of the photolacquer layer 6, and a new opaque layer 8 is applied over the developed surface to produce the structure of FIG. 1d. The opaque layer 8 is preferably a metal or a metal oxide, most preferably again a layer of chromium.

Figure 1E:
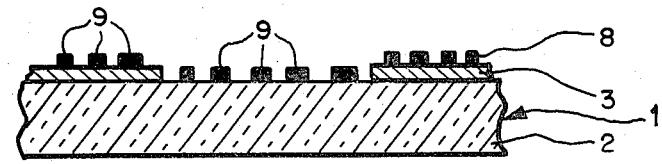

The remaining areas of photolacquer layer 6 are then removed, thus removing also those areas of the opaque layer 8 which lie upon the photolacquer layer 6, leaving behind as remains of the opaque layer 8 the opaque particles 9 as shown in FIG. 1e. The exposure mask 1 is now completed. Thus, exposure of the photolacquer layer 6 through the matt diffusion plate 7, followed by photolithographic processing which, instead of the usual etching step, includes the depositing of a new opaque layer 8, forms the exposure mask of FIG. 1e.

Chromium particles 9 adhere directly to the layer carrier 2 in those areas of the pattern which are desired to be diffusing. Areas desired to be transparent or opaque on the final pattern carrier plate are opaque on the exposure mask 1.

FIG. 2 shows stages in the process of producing the matt diffusion pattern on a pattern carrier plate, which process utilizes the exposure mask of FIG. 1e.

Figure 2A:
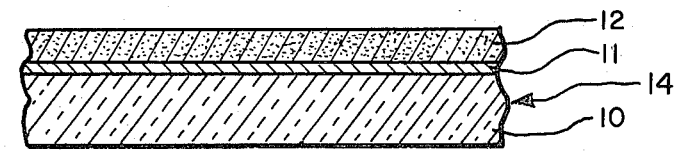
FIGS. 2a through 2d show stages in the production of the matt diffusion pattern on a pattern carrier plate.
Figure 2B:
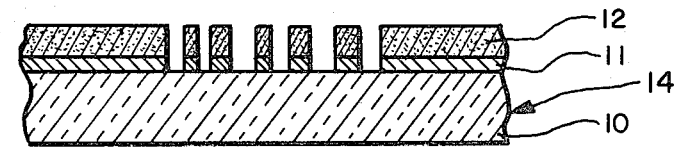

FIG. 2a shows the unprocessed pattern carrier plate 14 which comprises of a transparent carrier plate 10, an opaque layer 11 deposited on one face of the carrier plate 10, and a layer of photoresistant photolacquer 12 covering the opaque layer 11. The carrier plate 10 is preferably glass and the opaque layer 11 is preferably chromium.

Figure 2C:
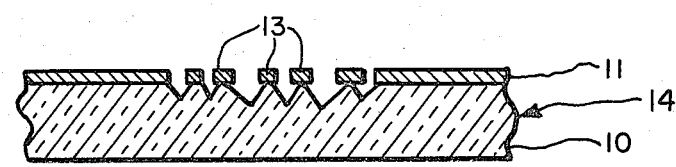

The photolacquer layer 12 is photographically exposed through the exposure mask 1 to imprint therein the image of the exposure mask 1. The photolacquer layer 12 is then developed to remove the exposed areas of the layer 12, and an etching substance is applied to etch away those portions of the opaque layer 11 which are not covered by photolacquer layer 12. This photolithographic process forms in the opaque layer 11 the image of the exposure mask 1, including opaque particles 13 which are an image of the opaque particles 9 of the exposure mask 1, as shown in FIG. 2c.

Next, the remains of the photolacquer layer 12 are removed and an etching substance is applied to etch away those portions of the surface of carrier plate 10 which are not covered by opaque layer 11. The etching of the carrier plate 10 is made deep, so that the opaque particles 13 are underetched, as shown in FIG. 2c, and thus removed.

Figure 2D:

Removal of the opaque particles 13 by etching leaves the etched surface areas of the carrier plate 10 jagged, as shown in FIG. 2d. These jagged areas form the matt diffusion pattern on the pattern carrier plate 14.

Finally, transparent areas of the final pattern are formed by removing those parts of the opaque layer 11 which correspond to those transparent areas. The formation of the transparent areas is preferably again accomplished photolithographically.

The exposure mask 1 can be reused in subsequent photolithographic processes to form additional diffusion plates 14.

This completes the production of the final pattern carrier plate in which matt diffusion patterns have been formed along with opaque and transparent patterns. Of course, it should be understood that various changes and modifications to the preferred embodiment described above will be apparent to those skilled in the art, which changes and modifications can be made without departing from the spirit or scope of the present invention.

I claim:

1. A process for the photolithographic production of a matt diffusion pattern, the process comprising the following steps:
    (a) providing a mask substrate having an opaque pattern formed thereon;
    (b) applying a mask photoresist layer to a face of the mask substrate over the opaque pattern;
    (c) exposing the mask photoresist layer through a matt diffusion plate;
    (d) developing the mask photoresist layer to remove portions thereof;
    (e) applying an opaque layer to the mask substrate face over the remaining portions of the mark photoresist layer;
    (f) removing the remaining portions of the mask photoresist layer together with the overlying portions of the opaque layer to form an exposure mask;
    (g) applying an opaque layer to a face of a transparent carrier plate;
    (h) applying a carrier plate photoresist layer to the carrier plate opaque layer;
    (i) exposing the carrier plate photoresist layer through the exposure mask;
    (j) developing the carrier plate photoresist layer to remove portions thereof;
    (k) etching the carrier plate opaque layer to remove exposed portions thereof;
    (l) removing the remaining portions of the carrier plate photoresist layer; and then
    (m) deeply etching the exposed portions of the carrier plate face to underetch and remove at least a portion of the remaining carrier plate opaque layer and thereby to form an optically diffusing patterned region.

2. The process of claim 1 wherein the diffusion plate is a plate of glass having at least one face mechanically ground.

3. The process of claim 1 wherein the diffusion plate is a plate of glass having at least one face chemically etched.

4. The process of claim 1 wherein at least one opaque layer is a metal.

5. The process of claim 1 wherein at least one opaque layer is a metal oxide.

6. The process of claim 1 further comprising the step of removing at least part of the carrier plate opaque layer to form a transparent pattern.

7. The process of claim 1 wherein the step of forming an exposure mask of a diffusion pattern is performed photolithographically.

8. The process of claim 1 wherein step (m) comprises sufficient under-etching to remove substantially all of the remaining carrier plate opaque layer over the optically diffusing patterned region.

9. A process for producing an exposure mask for the photolithographic production of a patterned optical diffuser having an optically diffusing region and an optically non-diffusing region, said process comprising the following steps:

(a) providing an exposure mask substrate having an opaque pattern formed thereon;

(b) applying a photoresist layer to a face of the mask substrate aligned with the opaque pattern;

(c) exposing the photoresist layer through a diffusion matt plate to form a pattern of exposed and unexposed regions on the photoresist layer;

(d) developing the photoresist layer to remove portions thereof and thereby to uncover underlying portions of the mask;

(e) applying an opaque layer over the remaining portions of the photoresist layer and the uncovered underlying portions of the face of the mask substrate; and then (f) removing the remaining portions of the photoresist layer and the portions of the opaque layer overlying the remaining portions of the photoresist layer, thereby producing a pattern of remaining portions of the opaque layer suitable for photolithographic production of an optical diffusing region.

10. The process of claim 9 wherein the diffusion plate comprises a ground glass plate.

11. The process of claim 9 wherein the opaque pattern formed on the exposure mask corresponds to the optically non-diffusing regions in the patterned optical diffuser produced thereby.

* * * * *

UNITED STATES PATENT AND TRADEMARK OFFICE
CERTIFICATE OF CORRECTION

PATENT NO. : 4,368,245

DATED : Jan. 11, 1983

INVENTOR(S) : Erich Bayer

It is certified that error appears in the above—identified patent and that said Letters Patent is hereby corrected as shown below:

In claim 9 section (c) please delete "diffusion matt" and insert therefor --matt diffusion--.

Signed and Sealed this

Sixteenth Day of August 1983

[SEAL]

Attest:

GERALD J. MOSSINGHOFF

Attesting Officer

Commissioner of Patents and Trademarks